US006278330B1

United States Patent
Ascarrunz

(12) United States Patent
(10) Patent No.: US 6,278,330 B1
(45) Date of Patent: Aug. 21, 2001

(54) FREQUENCY AND PHASE OFFSET SIGNAL GENERATOR AND METHOD

(76) Inventor: Franklin G. Ascarrunz, 440 Wellington Ave., Lafayette, CO (US) 80026

( * ) Notice: Subject to any disclaimer, the term of this patent is extended or adjusted under 35 U.S.C. 154(b) by 0 days.

(21) Appl. No.: 09/083,879

(22) Filed: May 22, 1998

(51) Int. Cl.[7] ........................................ H03L 7/06
(52) U.S. Cl. ............................ 331/16; 331/25; 331/27; 331/18; 327/106; 327/107
(58) Field of Search ........................ 327/105, 106; 331/16, 25, 50, 46, 18, 22; 375/376

(56) References Cited

U.S. PATENT DOCUMENTS 4,484,296  11/1984  Treise et al. .
5,184,092  * 2/1993  Shahriary et al. ..................... 331/16
5,451,910  * 9/1995  Gutherie ................................ 331/16
5,517,156  5/1996  Ikuzawa .
5,732,109  3/1998  Takahashi .
5,841,032  * 11/1998  Froggatt ................................ 73/597

FOREIGN PATENT DOCUMENTS 4-229703  8/1992  (JP) .

* cited by examiner

Primary Examiner—Arnold Kinkead
(74) Attorney, Agent, or Firm—Ancel W. Lewis, Jr.

(57) ABSTRACT

A signal generator and a method of generating a signal are disclosed that offsets phase and frequency of the output signal relative to the input signal by small increments, providing high resolution. The signal generator utilizes numerically controlled oscillators to instantly and independently offset phase and/or frequency.

24 Claims, 2 Drawing Sheets

FREQUENCY AND PHASE OFFSET SIGNAL GENERATOR AND METHOD

TECHNICAL FIELD

The present invention relates to electric signal generation and more particularly to a signal generator and method of generation that can selectively offset frequency and phase by small increments.

BACKGROUND ART

Prior known signal generators provided output signals at a different frequency from the input frequency by dividing the input and output down to a common frequency with frequency dividers and comparing the resultant common frequency signals. The resolution of these signal generators is limited by the common frequency.

One signal generator that offsets frequency offsets phase by changing the frequency over a selected time interval has the disadvantage that the frequency and phase offsetting of this device is not independent and phase offsetting is not instantaneous.

Direct digital synthesizers have been used to phase shift signals. Japanese Patent Application/Public Disclosure Document No. 4-229703 shows a method of generating waveforms with a direct digital synthesizer (DDS). Ikuzawa, U.S. Pat. No. 5,517,156, shows a digital phase shifter using a DDS.

Look-up tables in memory have been used to phase shift signals. Takahashi, U.S. Pat. No. 5,732,109, and Treise et al., U.S. Pat. No. 4,484,296 show examples of waveform table look-up memories in variable phase generators and phase detectors. The use of look-up tables is limited in the resolution or increment size by the available memory for the tables.

DISCLOSURE OF THE INVENTION

A signal generator and method of signal generation is disclosed that provides independent offsetting of phase and frequency, instant phase and frequency offsetting, and a stable output signal. The signal generator includes first and second numerically controlled oscillators that sequentially divide down an input signal and phase and/or frequency offset this first divided down signal. The first divided down signal is upconverted to generate a reference signal. A third numerically controlled oscillator in a phase locked loop is clocked by the output signal of an output oscillator to divide down the output signal to generate a second divided down signal. The second divided down signal is upconverted to generate a control signal. The control signal and reference signal are mixed in a phase detector to control the output oscillator.

BRIEF DESCRIPTION OF THE DRAWINGS

Details of this invention are described in connection with the accompanying drawings that bear similar reference numerals in which.

DETAILED DESCRIPTION OF THE INVENTION

Figure 1:
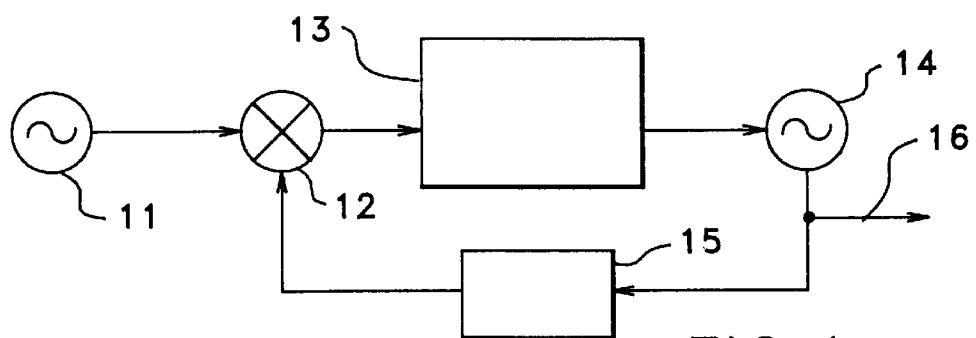
FIG. 1 is a schematic circuit diagram first embodiment of a signal generator embodying features of the present invention.

Referring now to FIG. 1 there is shown a signal generator embodying features of the present invention including an input signal source 11, a mixer 12, a loop filter 13, a voltage controlled oscillator 14 and a numerically controlled oscillator 15. The input signal source 11 provides a consistent reference signal of known reference frequency and phase to the mixer 12.

The voltage controlled oscillator 14 generates an output signal at a selected frequency and a selected phase, and outputs the output signal at output 16. The numerically controlled oscillator 15 is coupled or connected to voltage controlled oscillator 14 and utilizes the output signal as a clock signal. The numerically controlled oscillator 15 is programmed to output a control signal with the frequency of the reference signal based on the frequency of the output signal and therefore the clock signal.

The phase detector 12 is coupled to numerically controlled oscillator 15 and the control signal is applied as an input thereto. Phase detector 12 mixes or compares the reference signal and the control signal, and generates an error signal. Phase detector 12 can be a mixer or a frequency and phase detector. The error signal is applied to the loop filter 13 which is coupled to mixer 12. Loop filter 13 is coupled to voltage controlled oscillator 14 and provides an output that controls the frequency and phase of the output signal.

The numerically controlled oscillator 15 includes a frequency register and a phase register. These registers may be programmed with a microprocessor, with switches or the programming may be hardwired. The frequency of the signal output by the numerically controlled oscillator 15 is the clock frequency times the frequency register divided by $2^n$, where n is the number of bits of the frequency register. The frequency of the output of the signal generator is shifted by changing the frequency register which changes the frequency of the control signal and thereby changes the error signal. The loop filter 13 shifts the frequency of the output signal from the voltage controlled oscillator 14 until the control signal output by the numerically controlled oscillator 15 matches the frequency of the reference signal.

Similarly, phase shifts are accomplished through the phase register. Small frequency changes may be accomplished by periodic loading of the phase register with incremental phase changes. For example, the phase register could be incremented by $2\pi/10$ every $\frac{1}{10}$ of a second to shift the frequency of the control signal output by the numerically controlled oscillator 15 by 1 Hz.

This first embodiment shown in FIG. 1 may be utilized as a frequency synthesizer where the reference frequency and the output frequency are unrelated. For example, a 10.731 MHz reference signal could be used to generate a 40 MHz output signal. The frequency register of the numerically controlled oscillator 15 is programmed such that the numerically controlled oscillator 15 output frequency is 10.731 MHz with an input clock rate of 40 MHz. The present invention does not require dividing each signal by a common denominator as prior known devices required. Prior known devices would have divided the above reference and output signals to 1 kHz signals and compared the 1 kHz signals. The present invention provides significantly higher resolution.

It is understood that a fixed divider or prescaler can be connected between voltage controlled oscillator 14 and numerically controlled oscillator 15 to divide the output signal to a frequency that can be input to numerically controlled oscillator 15.

An example of a numerically controlled oscillator suitable for use in the present invention is the AD9830 made by Analog Devices, Inc., Norwood, Mass. The AD9830 includes a 32-bit phase accumulator, two 32-bit frequency registers and four 12-bit phase registers. Phase resolution is $2\Pi/2^n$ or $2\Pi/4096$ for this device.

Figure 2:
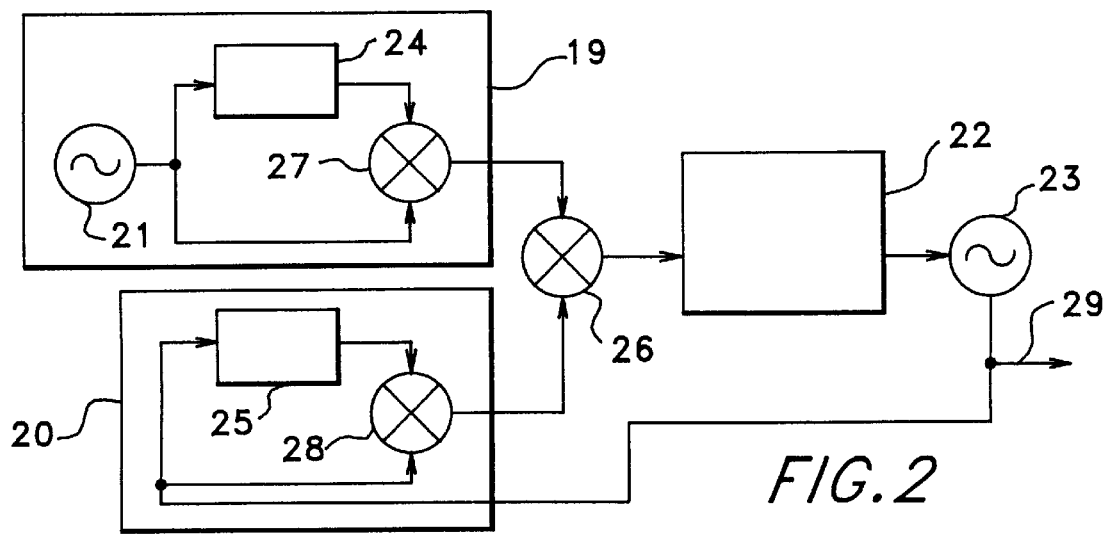
FIG. 2 is a schematic circuit diagram of a second embodiment of a signal generator embodying features of the present invention.

FIG. 2 shows a second embodiment of the present invention including a reference signal providing means 19, a control signal providing means 20, a loop filter 22, a voltage controlled oscillator 23, a phase detector 26 and an output 29. The reference signal providing means 19 includes an input signal source 21, a first numerically controlled oscillator 24, and a first mixer 27. The control signal providing means 20 includes a second numerically controlled oscillator 25 and a second mixer 28. The input signal source 21 is coupled to the first numerically controlled oscillator 24 and provides an input signal of a known frequency thereto. The first numerically controlled oscillator 24 divides down the input signal by $2^n$ where n is a selected integer. The first numerically controlled oscillator 24 is coupled to first mixer 27 and provides a first divided down signal thereto. The input signal source 21 is also coupled to the first mixer 27 and provides the input signal thereto.

The voltage controlled oscillator 23 generates an output signal. The voltage controlled oscillator 23 is coupled to the second numerically controlled oscillator 25 and provides the output signal as an input thereto. The voltage controlled oscillator 23 is also coupled to output 29 and provides the output signal thereto. The second numerically controlled oscillator 25 divides down the output signal by $2^m$, where m is an integer. The second numerically controlled oscillator 25 is coupled to second mixer 28 and provides a second divided down signal as an input thereto. The voltage controlled oscillator 23 is also coupled to the second mixer 28 and provides the output signal as an input thereto.

First mixer 27 upconverts the first divided down signal by mixing the input signal and the first divided down signal to generate a reference signal. First mixer 27 is coupled to and provides the reference signal as an input to phase detector 26. Second mixer 28 upconverts the second divided down signal by mixing the output signal and the second divided down signal to generate a control signal. Second mixer 28 is coupled to and provides the control signal as an input to phase detector 26. Phase detector 26 mixes the reference signal and the control signal to generate an error signal. The loop filter 22 is coupled to phase detector 26 and receives the error signal therefrom. The loop filter 22 is also coupled to voltage controlled oscillator 23 and controls the phase and the frequency of the output signal of voltage controlled oscillator 23.

The output signal is initially the same frequency as the input signal. The first divided down signal can be phase and frequency offset by the first numerically controlled oscillator 24, thereby phase and frequency offsetting the output signal. The input signal is divided down by $2^n$, with n an integer, by first numerically controlled oscillator 24 so that the ratio between the frequency of the input signal and the frequency of the first divided down signal is rational and exactly represented in the first numerically controlled oscillator 24, and the ratio between the phase of the input signal and the phase of the first divided down signal is rational and exactly represented in the first numerically controlled oscillator 24. Similarly, the frequency and phase ratios between the output signal and the second divided down signal are rational and exactly represented in the second numerically controlled oscillator 25 when the output signal is divided down by $2^m$. The first and second divided down signals are upconverted to reduce low frequency timing errors.

Figure 3:
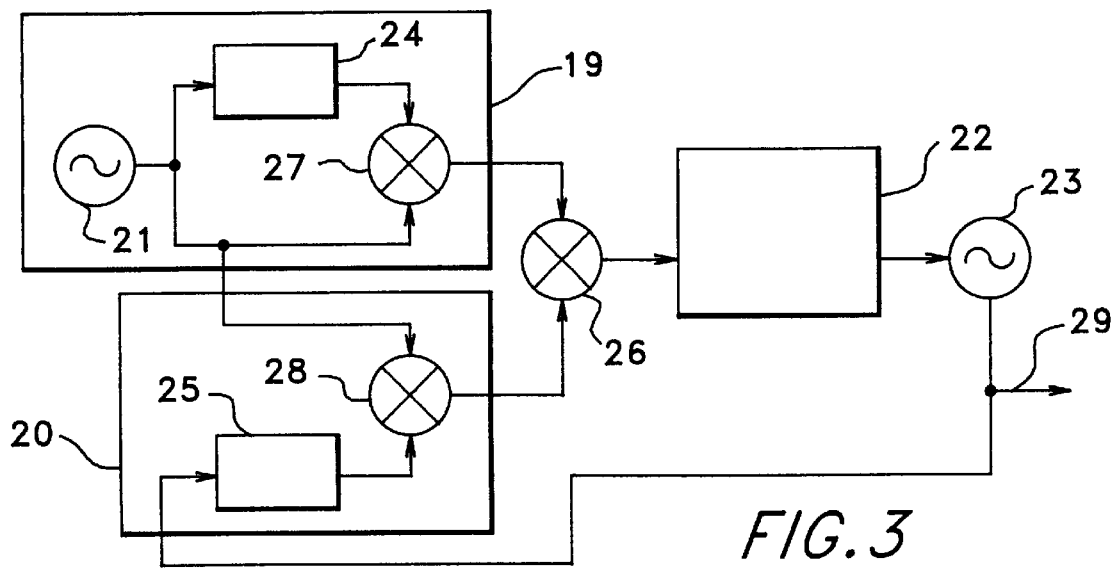
FIG. 3 is a schematic circuit diagram of an alternative to the second embodiment shown in FIG. 2.

FIG. 3 shows an alternative second embodiment of the present invention including a reference signal providing means 19, a control signal providing means 20, a loop filter 22, a voltage controlled oscillator 23, a phase detector 26 and an output 29. The reference signal providing means 19 includes an input signal source 21, a first numerically controlled oscillator 24, and a first mixer 27. The control signal providing means 20 includes a second numerically controlled oscillator 25 and a second mixer 28. The input signal source 21 is coupled to the first numerically controlled oscillator 24 and provides an input signal of a known frequency thereto. The first numerically controlled oscillator 24 divides down the input signal by $2^n$ where n is a selected integer. The first numerically controlled oscillator 24 is coupled to first mixer 27 and provides a first divided down signal thereto. The input signal source 21 is also coupled to the first mixer 27 and provides the input signal thereto.

The voltage controlled oscillator 23 generates the output signal. The voltage controlled oscillator 23 is coupled to the second numerically controlled oscillator 25 and provides the output signal thereto. The second numerically controlled oscillator 25 divides down the output signal by $2^m$. The second numerically controlled oscillator 25 is coupled to second mixer 28 and provides a second divided down signal thereto. The input signal source 21 is also coupled to the first mixer 27 and provides the input signal thereto.

First mixer 27 upconverts the first divided down signal by mixing the input signal and the first divided down signal to generate a reference signal. First mixer 27 is coupled to and provides the reference signal to phase detector 26. Second mixer 28 upconverts the second divided down signal by mixing the input signal and the second divided down signal to generate a control signal. Second mixer 28 is coupled to and provides the control signal to phase detector 26. Phase detector 26 mixes the reference signal and control signal to generate an error signal. The loop filter 22 is coupled to phase detector 26 and receives the error signal therefrom. The loop filter 22 is also coupled to voltage controlled oscillator 23 and controls the phase and frequency of voltage controlled oscillator 23.

The input signal, instead of the output signal, is mixed with the second divided down signal to generate the control signal in this alternative embodiment. The input signal is common to the upconverted reference signal and the upconverted control signal, and therefore cancels in phase detector 26, simplifying the phase and frequency offsetting. Also, the input and the desired output frequency can have a ratio $2^k:1$, k an integer, and second numerically controlled oscillator 25 can divide the output signal by $2^m$, where m+k=n, to generate the second divided down signal. The input and the desired output frequency could have a ratio $1:2^k$, k an integer, and second numerically controlled oscillator 25 could divide the output signal by $2^m$, where n+k=m, to generate the second divided down signal.

Figure 4:
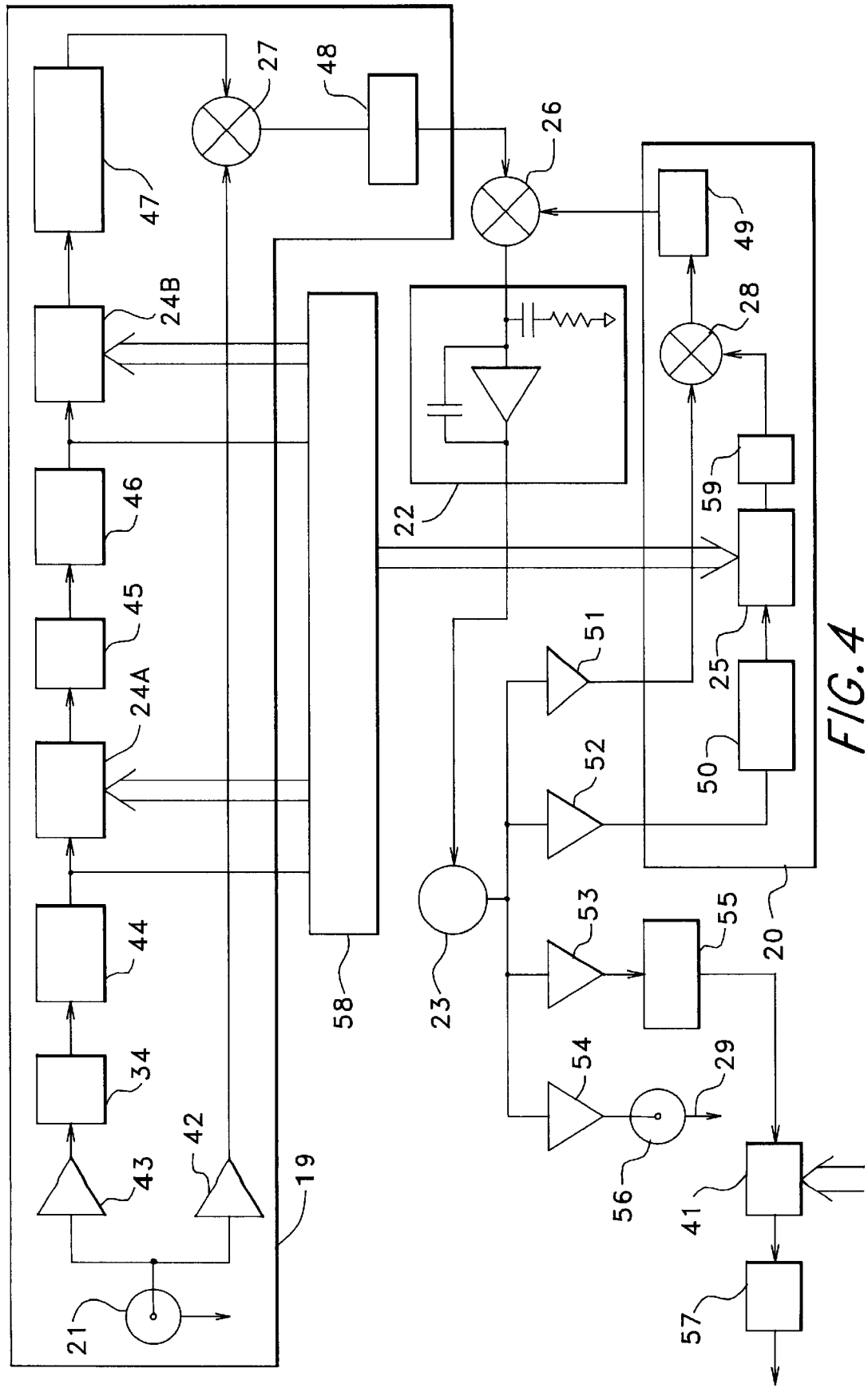
FIG. 4 is a more detailed schematic circuit diagram of the second embodiment of a signal generator shown in FIG. 2.

Referring now to FIG. 4, a more detailed second embodiment of the present invention is shown including a reference signal providing means 19, a control signal providing means 20, a loop filter 22, a voltage controlled oscillator 23, a phase detector 26, a fourth numerically controlled oscillator 41, a third isolation amplifier 51, a fourth isolation amplifier 52, a fifth isolation amplifier 53, a sixth isolation amplifier 54, a fourth comparator 55, an output node 56, a sync circuit 57, a controller 58 and an output 29.

The reference signal providing means 19 includes an input signal source 21, a first isolation amplifier 42, a second isolation amplifier 43, a frequency multiplier 34, a first comparator 44, a first numerically controlled oscillator 24A, a first antialiasing filter 45, a second comparator 46, a second numerically controlled oscillator 24B, a second antialiasing filter 47, a first mixer 27 and a first amplifier 48.

The control signal providing means 20 includes a third comparator 50, a third numerically controlled oscillator 25, a third antialiasing filter 59, a second mixer 28 and a second amplifier 49.

Input signal source 21 provides a stable input signal at a known frequency. First isolation amplifier 42 is connected to input signal source 21 and receives the input signal. Frequency multiplier 34 is connected to first isolation amplifier 42. Frequency multiplier 34 receives the input signal and multiplies the frequency by eight to generate a multiplied signal. First comparator 44 is connected between frequency multiplier 34 and first numerically controlled oscillator 24A, and conditions the multiplied signal. The multiplied signal is received by first numerically controlled oscillator 24A which divides the multiplied signal by $2^n$, n being an integer, and selectively phase and frequency offsets the resultant signal to generate an intermediate signal.

First antialiasing filter 45 and second comparator 46 are connected between first numerically controlled oscillator 24A and second numerically controlled oscillator 24B. The intermediate signal is filtered by first antialiasing filter 45, conditioned by second comparator 46 and input to second numerically controlled oscillator 24B. Second numerically controlled oscillator 24B divides the intermediate signal by $2^m$, where m is an integer, and selectively phase and frequency offsets the resultant signal to generate a first divided down signal. The first divided down signal is filtered by a second antialiasing filter 47 which is connected to second numerically controlled oscillator 24B, and input to first mixer 27 which is connected to second antialiasing filter 47.

A second isolation amplifier 42 is connected to input signal source 21 and to first mixer 27, receiving the input signal from input signal source 21 and inputting the input signal to first mixer 27. A first mixer 27 upconverts the first divided down signal by mixing the first divided down signal and the input signal to generate a reference signal.

Voltage controlled oscillator 23 generates an output signal. Voltage controlled oscillator 23 is connected through fourth isolation amplifier 52 and third comparator 50 to third numerically controlled oscillator 25, and inputs the output signal thereto. Third numerically controlled oscillator 25 divides down the output signal by $2^{m+n-3}$ to generate a second divided down signal. The second divided down signal is filtered by third antialiasing filter 59, which is connected to third numerically controlled oscillator 25, and input into second mixer 28 which is connected to third antialiasing filter 59. Voltage controlled oscillator 23 is connected through third isolation amplifier 51 to second mixer 28 and inputs the output signal thereto. Second mixer 28 upconverts the second divided down signal by mixing the second divided down signal and the output signal to generate a control signal.

A first amplifier 48, connected to first mixer 27, amplifies the reference signal and inputs the reference signal to phase detector 26, connected thereto. Second amplifier 49 connected to second mixer 28, amplifies the control signal and inputs the control signal to phase detector 26, connected thereto. Phase detector 26 mixes the reference signal and control signal to generate an error signal. The loop filter 22 is coupled to phase detector 26 and receives the error signal therefrom. The loop filter 22 is also coupled to voltage controlled oscillator 23 and controls the phase and frequency of the output signal of the voltage controlled oscillator 23. Loop filter 22 is shown to include an amplifier, a capacitor connected across the amplifier, and a series circuit of a capacitor and resistor between the input of the amplifier and ground.

Voltage controlled oscillator 23 is connected through fifth isolation amplifier 53 and fourth comparator 55 to fourth numerically controlled oscillator 41, and inputs the output signal thereto. Fourth numerically controlled oscillator 41 generates a one pulse per second sync signal and inputs the sync signal to sync circuit 57 for synchronization with an external event. Voltage controlled oscillator 23 is connected through sixth isolation amplifier 54 to output 56 which is the output of the signal generator.

Controller 58 is connected to first numerically controlled oscillator 24A, second numerically controlled oscillator 24B, third numerically controlled oscillator 25 and fourth numerically controlled oscillator 41. In the preferred embodiment disclosed controller 58 is a microprocessor that can continually write to the frequency and phase registers of each of the numerically controlled oscillators. Controller 58 alternatively could be thumbwheel switches or hardwiring.

The method of generating a signal according to the present invention includes providing a reference signal having a reference frequency and a reference phase, providing an output signal having a selected output frequency and a selected output phase, generating a control signal at the reference frequency and the reference phase from the output signal, offsetting the control signal by a selected first offset frequency and a selected first offset phase, mixing the reference signal and the control signal to provide an error signal, and controlling the output signal with said error signal to generate an output signal having a selected frequency offset and a selected phase offset relative to a reference frequency and a reference phase. More particularly the method includes generating the reference signal by providing a stable input signal to a first numerically controlled oscillator, dividing down the input signal with the first numerically controlled oscillator to generate an intermediate signal, offsetting the phase and the frequency of the intermediate signal with the first numerically controlled oscillator, dividing down the intermediate signal with a second numerically controlled oscillator to generate a first divided down signal, offsetting the phase and the frequency of the first divided down signal with the second numerically controlled oscillator and upconverting the first divided down signal by mixing the input signal and the first divided down signal, and generating the control signal by dividing down the output signal with a third numerically controlled oscillator to generate a second divided down signal, offsetting the phase and the frequency of the second divided down signal with the third numerically controlled oscillator and upconverting the second divided down signal by mixing the output signal and the second divided down signal.

Although the present invention has been described with a certain degree of particularity, it is understood that the present disclosure has been made by way of example and that changes in details of structure may be made without departing from the spirit thereof.

What is claimed is:

1. A frequency and phase adjustable signal generator comprising:
    first means for providing a reference signal having a reference frequency and a reference phase,
    second means having an output for providing an output signal having a selected output frequency and a selected output phase,
    third means having an input connected to said output of said second means responsive to said output signal for providing a control signal at said reference frequency and said reference phase, said third means selectively offsetting said control signal by a selected first offset frequency and a selected first offset phase,
    fourth means responsive to said reference signal and said control signal for mixing said reference signal and said control signal to provide an error signal, and
    fifth means responsive to said error signal for controlling said output signal of said second means.

2. The signal generator as set forth in claim 1 wherein said fourth means is a first mixer.

3. The signal generator as set forth in claim 1 wherein said fifth means is a phase locked loop.

4. The signal generator as set forth in claim 1 wherein said second means is an output oscillator.

5. The signal generator as set forth in claim 1 wherein said second means is a voltage controlled oscillator.

6. The signal generator as set forth in claim 1 wherein said second means is a crystal oscillator.

7. The signal generator as set forth in claim 1 wherein said third means is a numerically controlled oscillator, said numerically controlled oscillator offsetting said control signal by a selected offset frequency and a selected offset phase, whereby said fourth means changes said error signal and said fifth means controls said second means to offset said output frequency and said output phase.

8. The signal generator as set forth in claim 1 wherein said first means includes an input signal source.

9. The signal generator as set forth in claim 1 wherein said first means includes:
    an input signal source that provides an input signal,
    a first numerically controlled oscillator responsive to said input signal to provide a first divided down signal, and
    a first mixer responsive to said input signal and said first divided down signal to provide said reference signal,
    said first numerically controlled oscillator offsetting said first divided down signal by a selected offset frequency and a selected offset phase, whereby said fourth means changes said error signal and said fifth means controls said output signal of said second means to offset said output frequency and said output phase.

10. The signal generator as set forth in claim 9 wherein said third means includes:
    a second numerically controlled oscillator responsive to said output signal to provide a second divided down signal, and
    a second mixer responsive to said output signal and said second divided down signal to provide said control signal.

11. The signal generator as set forth in claim 9 wherein said third means includes:
    a second numerically controlled oscillator responsive to said output signal to provide a second divided down signal, and
    a second mixer responsive to said input signal and said second divided down signal to provide said control signal.

12. The signal generator as set forth in claim 1 wherein said first means includes:
    an input signal source that provides an input signal,
    a frequency multiplier responsive to said input signal to provide a multiplied signal,
    a first numerically controlled oscillator responsive to said multiplied signal to provide an intermediate signal,
    a second numerically controlled oscillator responsive to said intermediate signal to provide a first divided down signal, and
    a first mixer responsive to said input signal and said first divided down signal to provide said reference signal,
    said first numerically controlled oscillator offsetting said intermediate signal by a selected first offset frequency and a selected first offset phase,
    said second numerically controlled oscillator offsetting said first divided down signal by a selected second offset frequency and a selected second offset phase, whereby said fourth means changes said error signal and said fifth means controls said output signal of said second means to change said output frequency and to change said output phase.

13. The signal generator as set forth in claim 12 wherein said third means includes:
    a third numerically controlled oscillator responsive to said output signal to provide a second divided down signal, and
    a second mixer responsive to said output signal and said second divided down signal to provide said control signal.

14. A frequency and phase adjustable signal generator comprising:
    an input signal source providing a reference signal at a reference frequency and reference phase,
    an output oscillator providing an output signal at a selected output frequency and a selected output phase,
    a numerically controlled oscillator coupled to said output oscillator providing a control signal at said reference frequency,
    a mixer coupled to said input signal source and said numerically controlled oscillator providing an error signal, and
    a loop filter coupled to said mixer and said output oscillator to control said output signal of said output oscillator,
    said numerically controlled oscillator offsetting said control signal by a selected offset frequency and a selected offset phase whereby said mixer changes said error signal and said loop filter controls said output signal of said output oscillator to offset said output frequency and to offset said output phase.

15. A frequency and phase adjustable signal generator comprising:
    a phase detector responsive to a reference signal and a control signal to provide an error signal,
    an input signal source for providing an input signal,
    a first numerically controlled oscillator responsive to said input signal to provide a first divided down signal, and
    a first mixer responsive to said input signal and said first divided down signal to provide said reference signal,
    an output oscillator that provides an output signal at an output frequency and output phase,
    a second numerically controlled oscillator responsive to said output signal to provide a second divided down signal, and a second mixer responsive to said output signal and said second divided down signal to provide said control signal, and a loop filter connected to said first mixer, responsive to said error signal to control said output oscillator, said first numerically controlled oscillator offsetting said first divided down signal by a selected offset frequency and a selected offset phase, whereby said first mixer changes said reference signal, said phase detector changes said error signal and said loop filter controls said output oscillator to offset said output frequency and said output phase.

16. A frequency and phase adjustable signal generator comprising:

a phase detector responsive to a reference signal and a control signal to provide an error signal, an input signal source that provides an input signal, a first numerically controlled oscillator responsive to said input signal to provide a first divided down signal, a first mixer responsive to said input signal and said first divided down signal to provide said reference signal, an output oscillator that provides an output signal at an output frequency, a second numerically controlled oscillator responsive to said output signal to provide a second divided down signal, a second mixer responsive to said input signal and said second divided down signal to provide said control signal, and a loop filter connected to said first mixer, responsive to said error signal to control said output oscillator, said first numerically controlled oscillator offsetting said first divided down signal by a selected offset frequency and a selected offset phase, whereby said first mixer changes said reference signal, said phase detector changes said error signal and said loop filter controls said output oscillator to offset said output frequency and said output phase.

17. A frequency and phase adjustable signal generator comprising:

a phase detector responsive to a reference signal and a control signal to provide an error signal, an input signal source that provides an input signal, a frequency multiplier responsive to said input signal to provide a multiplied signal, a first numerically controlled oscillator responsive to said multiplied signal to provide an intermediate signal, a second numerically controlled oscillator responsive to said intermediate signal to provide a first divided down signal a first mixer responsive to said input signal and said first divided down signal to provide said reference signal, an output oscillator that provides an output signal at an output frequency, a third numerically controlled oscillator responsive to said output signal to provide a second divided down signal, a second mixer responsive to said output signal and said second divided down signal to provide said control signal, and a loop filter connected to said first mixer, responsive to said error signal to control said output oscillator, said first numerically controlled oscillator offsetting said intermediate signal by a selected first offset frequency and a selected first offset phase, said second numerically controlled oscillator offsetting said first divided down signal by a selected second offset frequency and a selected second offset phase, whereby said first mixer changes said reference signal, said phase detector changes said error signal and said loop filter controls said output oscillator to offset said output frequency and said output phase.

18. The signal generator as set forth in claim 17 including a controller coupled to said first numerically controlled oscillator, said second numerically controlled oscillator and said third numerically controlled oscillator to control said first, second and third numerically controlled oscillators.

19. The signal generator as set forth in claim 18 wherein said controller is a microprocessor.

20. A method of generating a signal having a selected frequency offset and a selected phase offset relative to a reference frequency and a reference phase comprising the steps of:

providing a reference signal having said reference frequency and said reference phase, providing an output signal having a selected output frequency and a selected output phase at an output, generating a control signal at said reference frequency and said reference phase by connecting said output as an input to control said generating a control signal in response to said output signal, selectively offsetting said control signal by a selected first offset frequency and a selected first offset phase, mixing said reference signal and said control signal to provide an error signal, and controlling said output signal with said error signal.

21. The method of claim 20 wherein said step of providing a reference signal includes:

providing a stable input signal to a first numerically controlled oscillator, dividing down said input signal with said first numerically controlled oscillator to generate a first divided down signal, offsetting the phase and the frequency of said first divided down signal with said first numerically controlled oscillator, and upconverting said first divided down signal by mixing said input signal and said first divided down signal.

22. The method of claim 21 wherein said step of generating a control signal includes:

dividing down said output signal with a second numerically controlled oscillator to generate a second divided down signal, offsetting the phase and the frequency of said second divided down signal with said second numerically controlled oscillator, and upconverting said second divided down signal by mixing said output signal and said second divided down signal.

23. The method of claim 20 wherein said step of providing a reference signal includes:
   providing a stable input signal to a first numerically controlled oscillator,
   dividing down said input signal with said first numerically controlled oscillator to generate an intermediate signal,
   offsetting the phase and the frequency of said intermediate signal with said first numerically controlled oscillator,
   dividing down said intermediate signal with a second numerically controlled oscillator to generate a first divided down signal,
   offsetting the phase and the frequency of said first divided down signal with said second numerically controlled oscillator, and
   upconverting said first divided down signal by mixing said input signal and said first divided down signal.

24. The method of claim 23 wherein said step of generating a control signal includes:
   dividing down said output signal with a third numerically controlled oscillator to generate a second divided down signal,
   offsetting the phase and the frequency of said second divided down signal with said third numerically controlled oscillator, and
   upconverting said second divided down signal by mixing said output signal and said second divided down signal.

* * * * *